United States Patent [19]

Galkin et al.

[11] 4,301,402

[45] Nov. 17, 1981

[54] ELECTRICAL MEASURING CIRCUIT

[76] Inventors: Mikhail M. Galkin, ulitsa Dostoevskogo, 13, Kratovo Moskovskoi oblasti; Marat I. Kornienko, ulitsa Dugina, 10, kv. 66; Boris P. Podboronov, ulitsa Molodezhnaya, 30, kv. 50, both of Zhukovsky Moskovskoi oblasti; Sergei S. Sokolov, ulitsa Vavilova, 5/3, kv. 137, Leningrad; Anatoly V. Furman, ulitsa Chkalova, 21, kv. 6, Zhukovsky Moskovskoi oblasti, all of U.S.S.R.

[21] Appl. No.: 104,714

[22] Filed: Dec. 18, 1979

Related U.S. Application Data

[63] Continuation of Ser. No. 896,759, Apr. 17, 1978.

[51] Int. Cl.³ .............................................. G01R 27/02
[52] U.S. Cl. .................................. 324/62; 324/65 R; 324/DIG. 1
[58] Field of Search ................. 324/62, 65 R, DIG. 1; 73/765, 362 AR

[56] References Cited

U.S. PATENT DOCUMENTS 3,873,917 3/1975 Kreuzer .............................. 324/62

FOREIGN PATENT DOCUMENTS 2314754 5/1974 Fed. Rep. of Germany ........ 324/62
1264421 2/1972 United Kingdom .
480190 8/1975 U.S.S.R. .

OTHER PUBLICATIONS

Marjanovic et al., "A High Speed . . . "; The *Radio and Electronic Engineer*; vol. 38, No. 6, Dec. 1969, pp. 345–351.

*Primary Examiner*—Ernest F. Karlsen
*Attorney, Agent, or Firm*—Fleit & Jacobson

[57] ABSTRACT

A multipoint measuring device is based on a measuring bridge network and uses transducers which convert the quantity under measurement into an electrical signal, the transducers being divided into two identical groups, and being connected via a selector switch and main and auxiliary compensators in one or two adjacent arms of the measuring bridge network. With the transducers connected in two adjacent arms of the measuring bridge network, each transducer group is connected only in a single arm via its respective main compensator and its respective auxiliary compensator and the connection point of two auxiliary compensators is used as a measurement point of a measuring diagonal of the measuring bridge network. With the transducers connected in a single arm of the measuring bridge network, each transducer group is connected alternately in a respective arm via its respective main compensator and its respective auxiliary compensator, while only a respective auxiliary compensator is connected to the measurement point of the measuring diagonal of the measuring bridge network.

8 Claims, 8 Drawing Figures

ELECTRICAL MEASURING CIRCUIT

This is a continuation application of U.S. Ser. No. 896,759, filed Apr. 17, 1978.

FIELD OF THE INVENTION

The invention relates to electrical measuring devices, and, more particularly, to multipoint measuring devices. It is suitable for conducting multipoint measurements concerned with very diverse fields of industry and performed with the help of strain gauges and resistance thermometers. The invention is especially suitable for strength tests performed on commerical articles.

DESCRIPTION OF PRIOR ART

Known in the art is a measuring device using a measuring bridge network, the supply diagonal of which accepts a sine-wave or a d.c. supply voltage. Supply voltages taken from a power supply are delivered over a lead via two voltage regulators to a half-bridge network comprised of two series-connected transducers (cf. Auslegeschrift No. 2,314,754, FRG). Such a circuit can utilize a single transducer if the adjacent arm of the circuit is provided with a compensating transducer or an auxiliary resistor. The known multipoint measuring device is inoperative if a single transducer is incorporated therein so that no compensating transducer or auxiliary resistor is used. The measurement points of a measuring diagonal of the known device, which are provided when the two transducers connect each other or a single transducer connects the compensating transducer of the auxiliary resistor, are combined using a common bus. This feature makes the known device inoperative if either of the transducers is accidentally connected to the ground bus. Moreover, the known device can use transducers of identical characteristics with the result that a limited number of uses is possible in the case of multipoint measurements. Although the known device provides for the transfer of the potential produced by the power supply without distortion, it is unable to resist the effect of the impedance of the leads between the common buses of the measurement points and the device subassemblies, as well as the effect of the contact resistances and their changes in the circuit resulting from the action of temperature, humidity and other disturbing factors. It is especially important to eliminate these harmful effects when small quantities are to be measured.

SUMMARY OF THE INVENTION

An object of the invention is to provide for a multipoint measuring device which can be operated without troubles in the realm of commercial multipoint measurements.

Another object of the invention is to provide for an increased measurement accuracy.

With these and other objects in view, there is proposed a multipoint measuring device using a measuring bridge network and provided with transducers converting the quantity under measurement into an electrical signal, said transducers being coupled to the measuring bridge network via a selector switch and two identical voltage regulators, the supply voltage being applied to one of the diagonals of the measuring network, each of the voltage regulators being implemented, according to the invention, as a main compensator, the transducers being broken down into two similar groups and connected in the measuring bridge network via the main compensators and via two auxiliary compensators, identical to the main compensators and to each other. The transducers being connected in two adjacent arms of the measuring bridge network only when each transducer group is connected in a single arm via its respective main and auxiliary compensators, the connection point of the two identical auxiliary compensators being used as a measurement point of a measuring diagonal. The transducers are connected in a single arm of the measuring network only when a respective transducer group is alternately connected via its respective main compensator and its respective identical auxiliary compensator in that arm of the measuring bridge network, and only one of the auxiliary compensators is connected to the measurement point of the measuring diagonal, thereby resulting in compensation for the impedance of the leads between the selector switch and the transducers and for the contact resistance of the selector switch.

Advantageously, the multipoint measuring device comprises the transducers connected in one arm of the measuring bridge network along with a contact group of a measurement mode selector, connected in the same arm of the measuring bridge network, and with another contact group of the measurement mode selector, connected in the above-mentioned arm so that each contact group is coupled via its own compensator, or comprises the transducers connected in two adjacent arms of the measuring bridge network so that one of the main compensators is coupled to a supply point of a supply diagonal of the measuring bridge network via the contacts of said another contact group of the measurement mode selector and via the compensator of said another contact group.

Preferably, each arm of the measuring bridge network void of the transducers incorporates the contact groups of a measurement range selector and each said contact group is connected in a respective arm of the measuring bridge network via a respective compensator of said contact group.

Advantageously, a part of the contacts of the measurement range selector is connected in the arms of the measuring bridge network via resistors.

Reliable operation of the proposed device is attained in a condition when one or more transducers is at fault. The device provides for highly accurate measurements not influenced by harmful factors such as temperature, humidity and others.

DESCRIPTION OF THE DRAWINGS

Other features and advantages of the invention will appear from the following description of a preferred embodiment thereof in conjunction with the accompanying drawings, in which.

DESCRIPTION OF THE INVENTION

The multipoint measuring device of the invention, based on a measuring bridge network, comprises a supply diagonal ab (FIG. 1) which receives a supply voltage from a pulsed voltage source 1.

Transducers 2, 3 converting the quantity under measurement into an electrical signal (such as strain gauges, resistance thermometers and so on) are broken down into two identical groups. For the sake of convenience, each transducer group is presented in FIG. 1 as a single transducer. Note, however, that each group may involve any number of transducers desirable.

Figures 1, 2:
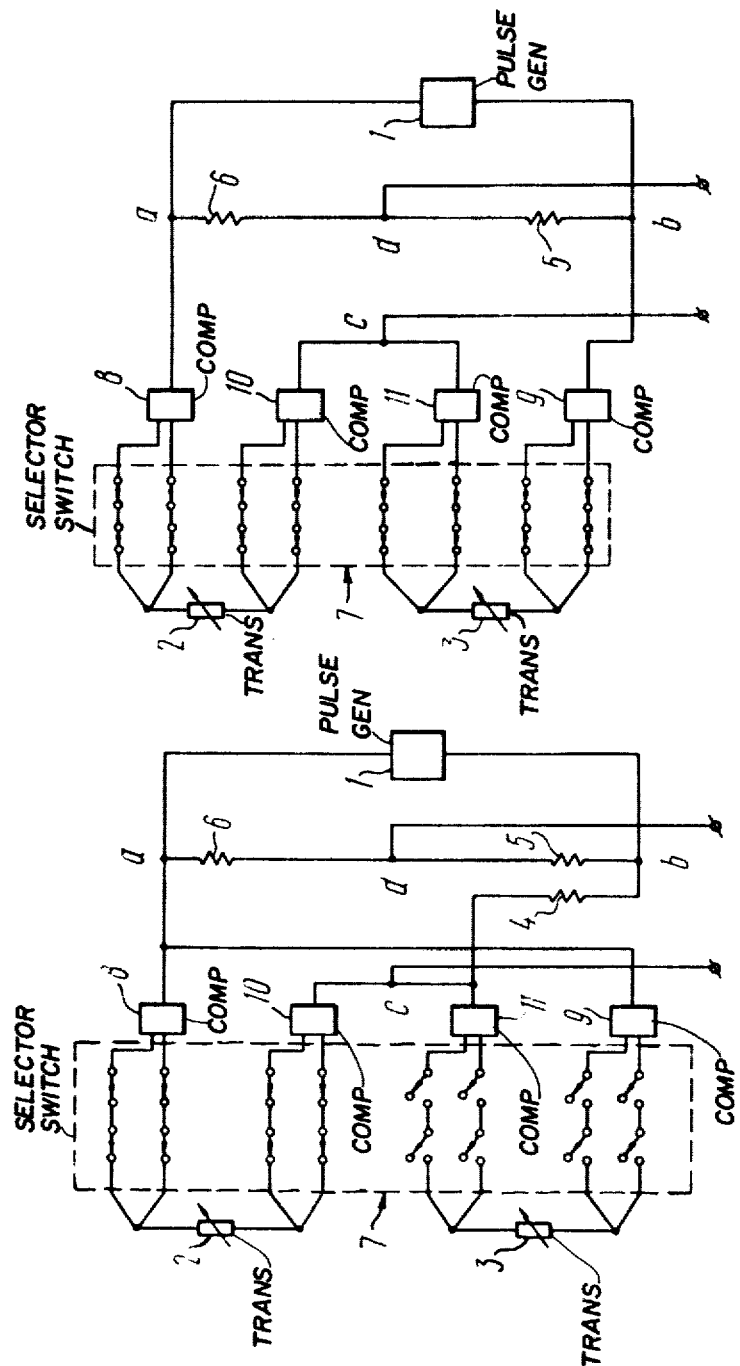
FIG. 1 is a schematic diagram of a multipoint measuring device provided with transducers connected in a single arm of a measuring bridge network, according to the invention.
FIG. 2 is a schematic diagram of a multipoint measuring device provided with transducers connected in two adjacent arms of the measuring bridge network, according to the invention.

The embodiment of FIG. 1 describes the transducers 2, 3 arranged in two groups which are connected in one arm of the measuring bridge network having its three other arms provided with resistors 4, 5, 6. The transducers 2, 3 are connected in the bridge network via a selector switch 7, identical compensators 8, 9 and compensators 10, 11 (identical to compensators 8, 9) which operate to compensate for the impedance of the leads and for the contact resistance of the selector switch 7. The number of selector stages of the selector switch 7 is chosen depending on conditions of reliable operation and may be as great as desirable (a two-stage selector switch 7 is used in the embodiment of FIG. 1).

The two groups of the transducers 2, 3 are placed alternately in one arm of the measuring bridge network through the selector switch 7 and the identical compensators 8–11, said first transducer group 2 being connected through the compensators 8, 10 and said second transducer group 3 being connected through the compensators 9, 11.

Moreover, the compensator 10 or 11 is always connected to a measurement point c of a measuring diagonal cd.

FIG. 2 illustrates an embodiment of the multipoint measuring device of the invention, wherein the transducer groups 2, 3 are connected in two adjacent arms of the measuring bridge network, the connection point of the compensators 10, 11 being coupled to the measurement point c of the measuring diagonal cd.

Figure 3:
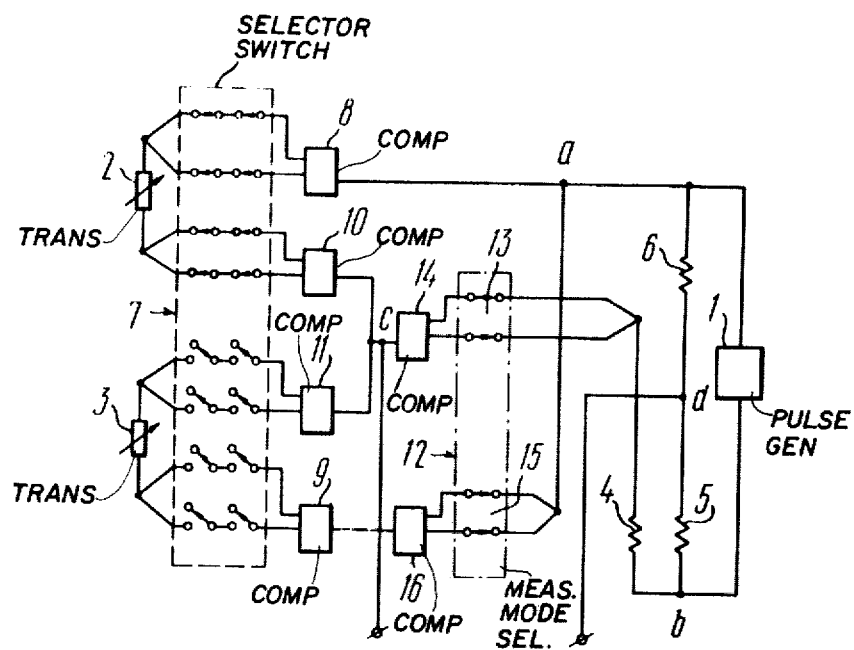
FIG. 3 is a schematic diagram of a multipoint measuring device with a measurement mode selector and transducers connected in a single arm of the measuring bridge network, according to the invention.

FIG. 3 illustrates an embodiment of the multipoint measuring device of the invention, providing a measurement mode selector 12 operated to switch over from a half-bridge circuit to a single transducer. One contact group 13 of the measurement mode selector 12 is placed via a compensator 14 in that arm of the measuring bridge network which incorporates the transducers 2, 3, while another contact group 15 of the measurement mode selector 12 is placed via a compensator 16 in the same arm. A compensator 14, identical to compensator 8–11, is connected to the measurement point c of the measuring diagonal cd.

Figure 4:
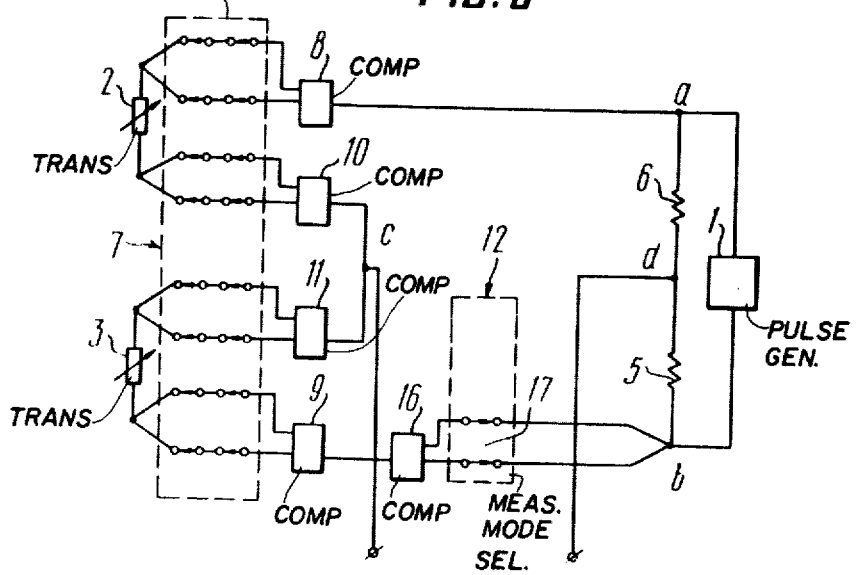
FIG. 4 is a schematic diagram of a multipoint measuring device with the measurement mode selector and transducers connected in two adjacent arms of the measuring bridge network, according to the invention.

FIG. 4 illustrates an embodiment of the multipoint measuring device of the invention having its transducers 2, 3 connected in two adjacent arms of the measuring bridge network with the help of the measurement mode selector 12 whose contact group 17 is placed in one of the adjacent arms via the compensator 16 identical to compensators 8–11. The compensators 10, 11 are connected to the measurement point c of the measuring diagonal cd.

Figure 5:
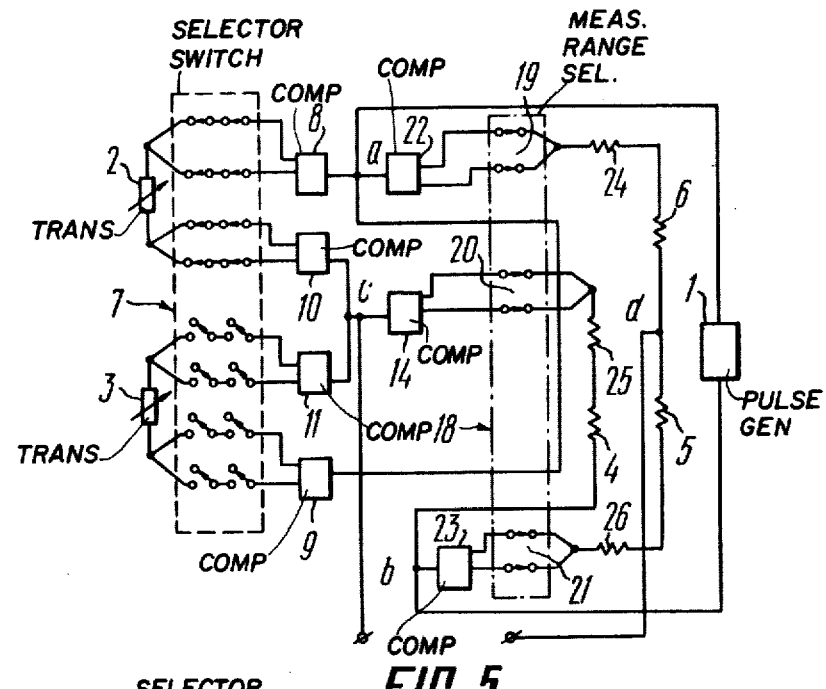
FIG. 5 is a schematic diagram of a multipoint measuring device with a measurement range selector and transducers connected in a single arm of the measuring bridge network, according to the invention.
Figure 6:
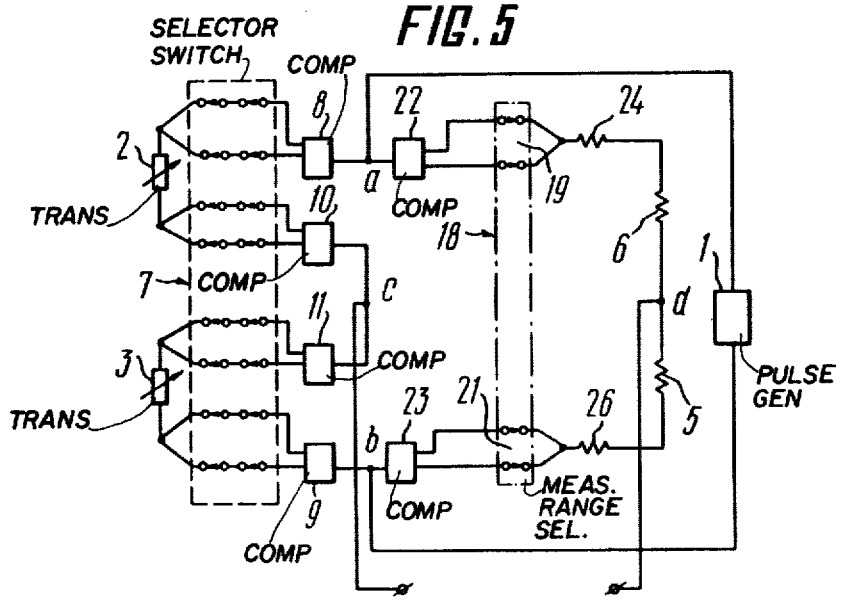
FIG. 6 is a schematic diagram of a multipoint measuring device with the measurement range selector and transducers connected in two adjacent arms of the measuring bridge network, according to the invention.

FIGS. 5, 6 illustrate an embodiment of the multipoint measuring device provided with a measurement range selector 18.

Contact groups 19, 20, 21 of the measurement range selector 18 are placed in respective arms of the measuring bridge network via their respective compensators 22, 14, 23 and via their respective auxiliary resistors 24, 25, 26. The embodiments of FIGS. 5, 6 differ from one another in that the transducers 2, 3 are connected in one arm of the measurement bridge network (FIG. 5) and in two adjacent arms thereof (FIG. 6).

Figure 7:
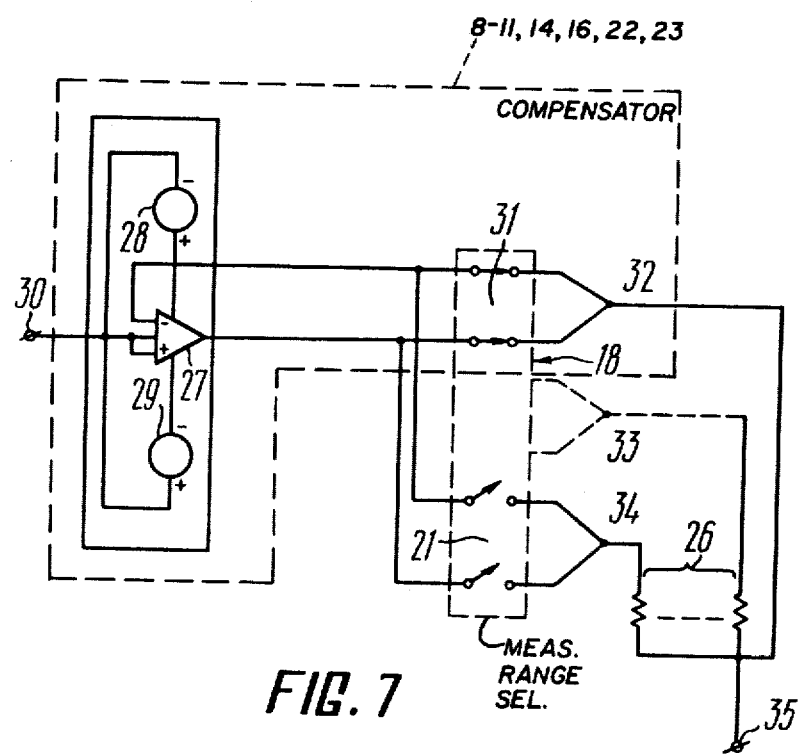
FIG. 7 is a schematic diagram of a compensator, according to the invention.

A compensator shown in FIG. 7 can be used as any one of the above-mentioned compensators 8–11, 14, 16, 22, 23. This compensator comprises an operational amplifier 27 and two separate power sources 28, 29 having their mid point connected to the noninverted input of the operational amplifier 27 and used as an input 30 of the compensator.

The inverted input of the operational amplifier 27 is coupled to its output via contacts which may be generally as follows: the contacts between the leads of the selector switch 7 and the transducers; the contacts of the contact groups of the measurement mode selector 12; and/or the contacts of the contact groups of the measurement range selector 18. FIG. 7 shows the use of the contacts of contact groups 31, 21 of the measurement range selector 18; note that the contacts 31 are closed and the contacts 21 are open. Common points 32, 33, 34 of contact groups 31–21 are coupled either in a direct way (the point 32 is coupled to a second input 35 of the compensator) or through resistors 26 whose number is equal to that of the ratings of the transducers used in the multipoint measuring device. This also applies to the selection of the resistors 24, 25, 26 (FIGS. 5, 6) placed in the other arms of the measuring bridge network, an equal number of these resistors being selected for each set of the transducers.

Figure 8:
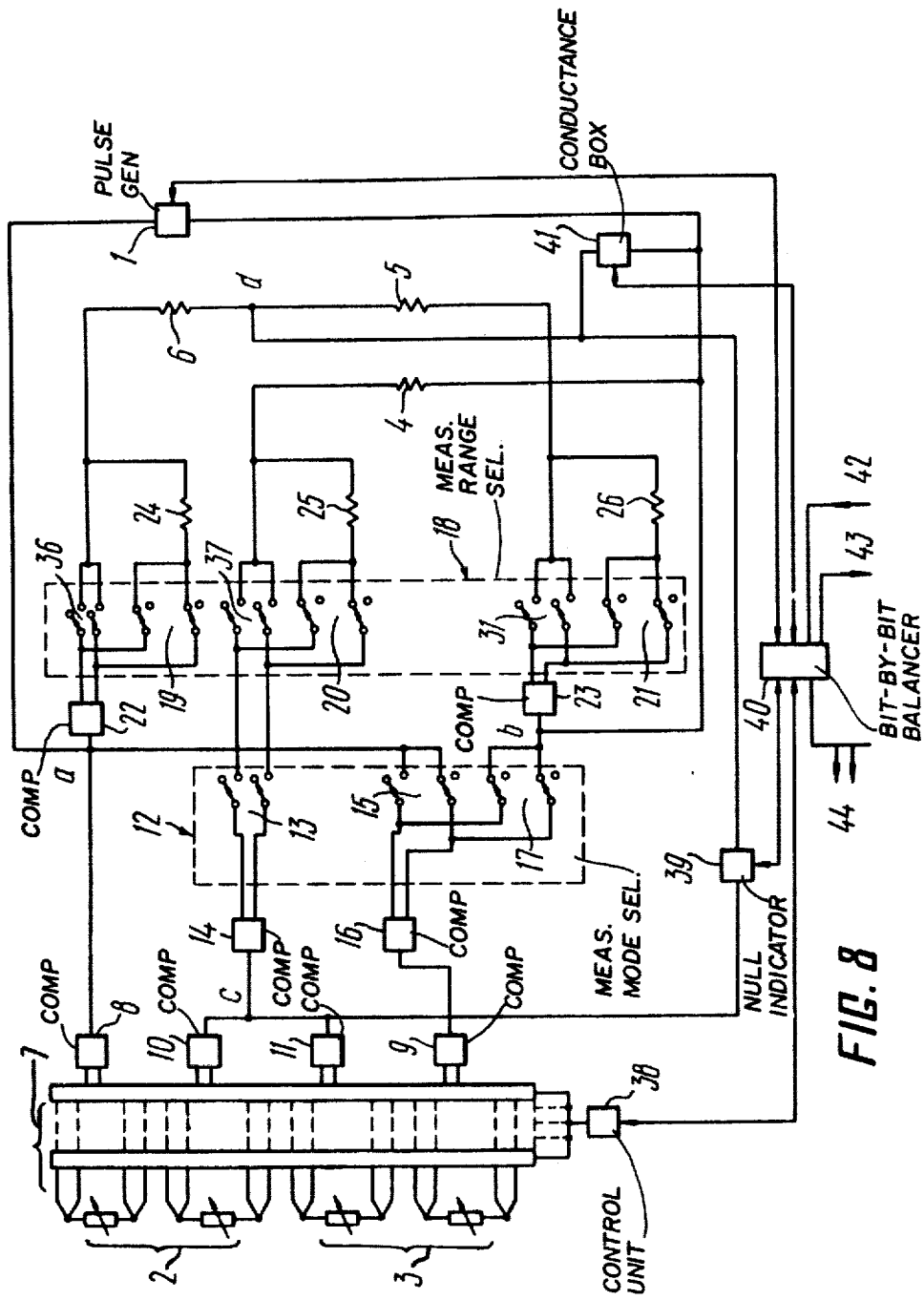
FIG. 8 is a detailed schematic diagram of a multipoint measuring device, according to the invention.

FIG. 8 illustrates a detailed schematic diagram of the multipoint measuring device provided with two groups of the transducers 2, 3 (hereinafter referred to as transducers groups 2, 3) incorporated in two adjacent arms of the measuring bridge network. The proposed device has the measurement mode selector 12 with contact groups 13, 15, 17 and the measurement range selector 18 with contact groups 36, 19, 37, 20, 31, 21. Each said contact group is placed in a respective arm of the measuring bridge network via its respective compensator. The contact groups 13, 15, 17 of the measurement mode selector 12 are provided with their respective compensators 14, 16, while the contact groups 36, 19 and 31, 21 of the measurement range selector 18 are provided with their respective compensators 22, 23. The contact groups 37, 20 of the measurement range selector 18 are connected through the compensator 14 together with the contact group 13 of the measurement mode selector 12.

The contact groups 19–21 of the measurement range selector 18 are placed in their respective arms of the measuring bridge network via respective resistors 24–26.

The selector switch 7 is controlled with the help of a control unit 38.

A null indicator 39 is inserted in the measuring diagonal cd of the measuring bridge network. The power source 1 is a heteropolar pulse generator coupled to a bit-by-bit balancer 40 which operates to control a conductance box 41.

An input 42 and outputs 43, 44 of the bit-by-bit balancer 40 are coupled to a computer (not shown in the drawings) which provides for synchronized operation of the control unit 38, the bit-by-bit balancer 40 and the heteropolar pulse generator. The computer receives measurement results and processes them.

The multipoint measuring device of the invention operates as follows.

With the transducers placed in a certain arm of the measuring bridge network, the required transducer is selected by making respective contacts of the matrices of the selector switch 7. This is attained in any conventional manner according to a signal available from the control unit 38. The transducer group 2 is first connected between the measurement point c and the supply point a. In this mode, the contact group 13 of the measurement mode selector 12 is closed and the contact resistance of this group is eliminated by the compensator 14.

If the rating of the transducer incorporated in an arm of the measuring bridge network corresponds to the ratings of the resistors 4, 5, 6 in the remaining arms, then the contact groups 36, 37, 31 of the measurement range selector 18 are closed to prevent the resistors 24–26 from being placed in respective arms of the measuring bridge network. If the rating of the transducer exceeds the ratings of the resistors 4–6 in the remaining arms, then the contact groups 36, 37, 31 are open and the resistors 24–26 are connected in respective arms of the measuring bridge network via the closed contact groups 19, 20, 21.

After the transducer group 2 has been interrogated, the transducer group 3 is enabled and the contact groups 13, 15 of the measurement mode selector 12 are closed in this case. The position of the measurement range selector 18 is determined as described above.

Now consider an operating mode in which two transducers, each of which belongs to its respective transducer group 2 and 3, are connected concurrently in two adjacent arms of the measuring bridge network as follows: the transducer of the transducer group 2 is placed between the measurement point c and the supply point a, and the transducer of the transducer group 3 is placed between the measurement point c and the supply point b. An order according to which the transducers are connected within their respective transducer groups 2, 3 is determined by a respective signal from the control unit 38 by switching over the contacts of the selector switch 7.

In this mode, the contact group 17 of the measurement mode selector 12 is closed and the contact groups 13, 15 of this selector are made open.

In any measurement mode, a signal from the measuring diagonal cd comes to the input of the null indicator 39 and the bit-by-bit balancer 40 is activated each time the phase of the signal is changed. Balance of the measuring bridge network is made during each step of the measurement cycle by shunting the arm of the network, containing the resistor 5, with the help of the conductance box 41 which has the ratings of its legs proportional to binary code. At balance the output of the bit-by-bit balancer 40 produces a numerical equivalent of the increment value of the resistance of the transducer in a respective arm of the measuring bridge network. The computer operates to synchronize the operation of the control unit, 38, the bit-by-bit balancer 40 and the heteropolar pulse generator and to process measurement results delivered to it from the bit-by-bit balancer 40.

The compensators 8–11, 14, 16, 22, 23 operate to prevent the measurement results from being affected by the impedance of the leads between the selector switch 7 and the transducers as well as random changes occurred in the impedance. Also, the effect of the contact resistance of the selector switch 7, the measurement mode selector 12 and the measurement range selector 18 is eliminated with the result that measurement accuracy not worse than 0.1% is attained due to the fact that key equivalents are formed which have a negligible resistance.

The transducer groups 2, 3 connected in the measuring bridge network with the help of the selector switch 7 make it possible to eliminate the influence of a faulty transducer circuit on measurement results provided by the remaining transducers. The proposed device can connect a single transducer in a single arm or several transducers in a half-bridge circuit. The measurement range selector 18 provides for the use of transducers of different ratings, thereby resulting in greater number of possible applications of the device.

What is claimed is:

1. A multipoint measuring device comprising:
   a measuring bridge network;
   a plurality of transducers for converting a quantity under measurement to an electrical signal, said plurality of transducers divided into two identical groups to be selectively connected in one arm of said measuring bridge network;
   a selector switch for selectively connecting one or the other of said two identical groups of transducers in said one arm of said measuring bridge network;
   a first, a second, a third and a fourth compensator for providing a voltage to compensate for the impedance of the leads between said selector switch and said transducers and for the contact resistance of said selector switch;
   said first and third compensators belonging to said first transducer group, each being connected to said selector switch, said first compensator being connected to a supply point of said bridge network and said third compensator being connected to a measurement point of a measuring diagonal of said bridge network;
   said second and fourth compensators belonging to said second transducer group, each being connected to said selector switch, said second compensator being connected to a supply point of said bridge network and said fourth compensator being connected to a measurement point of a measuring diagonal of said bridge network;
   said first transducer group and said second transducer group connected alternatively in said one arm of said measuring bridge network by action of said selector switch via their said respective first, third, second and fourth compensators, whereby said first, third and second, fourth compensators provide voltage compensation for the impedance of the leads between said selector switch and said respective group of transducers and compensation for the contact resistance of said selector switch during a measurement operation.

2. A multipoint measurement device comprising:

a measuring bridge network;

a plurality of transducers for converting a quantity under measurement to an electrical signal, said plurality of transducers being divided into two identical groups;

each transducer group connected in one of adjacent arms of said measuring bridge network;

a selector switch used to connect said transducers in said adjacent arms of said measuring bridge network;

a first, a second, a third and a fourth compensator providing voltage compensation for the impedance of the leads between said selector switch and said transducers and for the contact resistance of said selector switch;

said first and third compensators belonging to said first transducer group, each being connected to said selector switch, said first compensator being connected to a supply point of said bridge network and said third compensator being connected to a measurement point of a measuring diagonal of said bridge network;

said second and fourth compensators belonging to said second transducer group, each being connected to said selector switch, said second compensator being connected to a supply point of said bridge network and said fourth compensator being connected to a measurement point of a measuring diagonal of said bridge network;

said first transducer group connected in one arm of said measuring bridge network via said first and third compensators and said second transducer group connected in the arm of said measuring bridge network adjacent to said one arm, via said second and fourth compensators, said connections being implemented by said selector switch so that the connection point of said third and fourth compensators is used as the measurement point of the measuring diagonal of said measuring bridge network, whereby said compensators act to provide a voltage to compensate for the impedance of the leads between said selector switch and transducers and compensation for the contact resistance of said switch.

3. A multipoint measuring device as claimed in claim 1, comprising:

a fifth and a sixth compensator;

a measurement mode selector with contacts arranged in two groups;

said first contact group of said measurement mode selector, connected via said fifth compensator in the arm of said measuring bridge network, which incorporates said transducers;

said second contact group of said measurement mode selector, connected via said sixth compensator in the same arm of said measuring bridge network.

4. A multipoint measuring device as claimed in claim 2, comprising:

a fifth compensator;

said measurement mode selector with contacts, connected via said fifth compensator in one arm of said measuring bridge network, which incorporates one of said transducer groups, said fifth compensator being coupled to a supply point of a supply diagonal of said measuring bridge network.

5. A multipoint measuring device as claimed in claim 3, comprising:

a measurement range selector with contact groups;

said contact groups connected in the remaining arms of said measuring bridge network;

an seventh an eight and a ninth compensator used to place each respective contact group of said contact groups of said measurement range selector in a respective arm of said measuring bridge network.

6. A multipoint measuring device as claimed in claim 4, comprising:

said measurement range selector with contact groups;

said contact groups connected in the remaining arms of said measuring bridge network;

a sixth and a seventh compensator used to place each respective contact group of said contact groups of said measurement range selector in a respective arm of said measuring bridge network.

7. A multipoint measuring device as claimed in claim 5, comprising resistors connected in those arms of said measuring bridge network which incorporate said contact groups of said measurement range selector.

8. A multipoint measuring device as claimed in claim 6, comprising resistors connected in those arms of said measuring bridge network which incorporate said contact groups of said measurement range selector.

* * * * *